United States Patent
Sugie (10) Patent No.: US 8,222,846 B2
(45) Date of Patent: Jul. 17, 2012

(54) OUTPUT CIRCUIT

(75) Inventor: Hisashi Sugie, Kyoto (JP)

(73) Assignee: Rohm Co., Ltd. (JP)

( * ) Notice: Subject to any disclaimer, the term of this patent is extended or adjusted under 35 U.S.C. 154(b) by 359 days.

(21) Appl. No.: 12/693,489

(22) Filed: Jan. 26, 2010

(65) Prior Publication Data

US 2011/0031918 A1 Feb. 10, 2011

(30) Foreign Application Priority Data

Jan. 26, 2009 (JP) ................................. 2009-014242
Dec. 28, 2009 (JP) ................................. 2009-298546

(51) Int. Cl.
H02P 6/00 (2006.01)
H02P 3/12 (2006.01)
H02P 6/16 (2006.01)
H02P 6/10 (2006.01)
H02H 7/08 (2006.01)
H02K 29/08 (2006.01)
G05F 1/00 (2006.01)
H03K 17/56 (2006.01)

(52) U.S. Cl. .............. 318/400.29; 318/379; 318/400.04; 318/400.21; 318/400.23; 318/400.39; 323/282; 323/284; 323/285; 327/424

(58) Field of Classification Search .................. 318/379, 318/400.04, 400.21, 400.23, 400.29, 400.39; 323/282, 284, 285; 327/424

See application file for complete search history.

(56) References Cited

U.S. PATENT DOCUMENTS

| | | | | |
|---|---|---|---|---|
| 4,535,276 | A | * | 8/1985 | Yokobori ................. 318/400.04 |
| 7,557,557 | B2 | * | 7/2009 | Sugie et al. ................... 323/316 |
| 2010/0277155 | A1 | * | 11/2010 | Taki .............................. 323/299 |
| 2011/0050316 | A1 | * | 3/2011 | Sicard ........................... 327/309 |

FOREIGN PATENT DOCUMENTS

JP    2001-160615 A    6/2001

* cited by examiner

*Primary Examiner* — Walter Benson
*Assistant Examiner* — Gabriel Agared
(74) *Attorney, Agent, or Firm* — Cantor Colburn LLP (57) ABSTRACT

A power transistor is arranged between an output terminal and a power supply terminal. A pre-driver includes a high-side transistor and a low-side transistor connected in series between the power supply terminal and a second terminal, and the ON/OFF operations of which are controlled in a complementary manner according to a control signal. The electric potential at a connection node between the two transistors is output to a control terminal of the power transistor. A constant voltage circuit stabilizes the second terminal to a predetermined voltage. An output transistor for the constant voltage circuit is provided between the second terminal and the ground terminal. A differential amplifier adjusts the voltage applied to the control terminal of the output transistor such that the electric potential at the second terminal approaches a predetermined target value. A feedback capacitor is provided between the second terminal and the control terminal of the output transistor.

10 Claims, 5 Drawing Sheets

FIG.1

COMPARISON TECHNIQUE

○ INPUT/OUTPUT TRUTH TABLE

| INPUT METHOD | INPUT | | | | OUTPUT | |
|---|---|---|---|---|---|---|
| | PS*5 | PWM | INA | INB | OUTA | OUTB |
| EN/IN | H | H | L | X | L | L |
| | | | H | L | H | L |
| | | | H | H | L | H |
| IN/IN | | L | L | L | Z | Z |
| | | | H | L | H | L |
| | | | L | H | L | H |
| | | | H | H | L | L |
| - | L | X | X | X | Z | Z |

L; Low, H; High, X; Don't care, Z; Hi impedance
*5 PS TERMINAL INPUT LOGICAL VALUE High;IC ACTIVE STATE Low;IC STANDBY STATE

FIG.5B

○ OUTPUT SWITCHING SPEED (H Bridge)
CONDITION Ta=25°C, VCC=3.0V, VM=5.0V  UNIT;ns

| TR1 | TR2 | TURN-ON TIME | TURN-OFF TIME | Rise Time | Fall Time |
|---|---|---|---|---|---|
| Low | Low | 150 | 50 | 30 | 15 |
| High | Low | 250 | 70 | 120 | 20 |
| Low | High | 400 | 80 | 300 | 25 |
| High | High | 700 | 100 | 600 | 30 |

OUTPUT CIRCUIT

BACKGROUND OF THE INVENTION

1. Field of the Invention

The present invention relates to an output circuit which outputs a voltage that corresponds to the ON state (OFF state) of a power transistor.

2. Description of the Related Art

Figure 1:
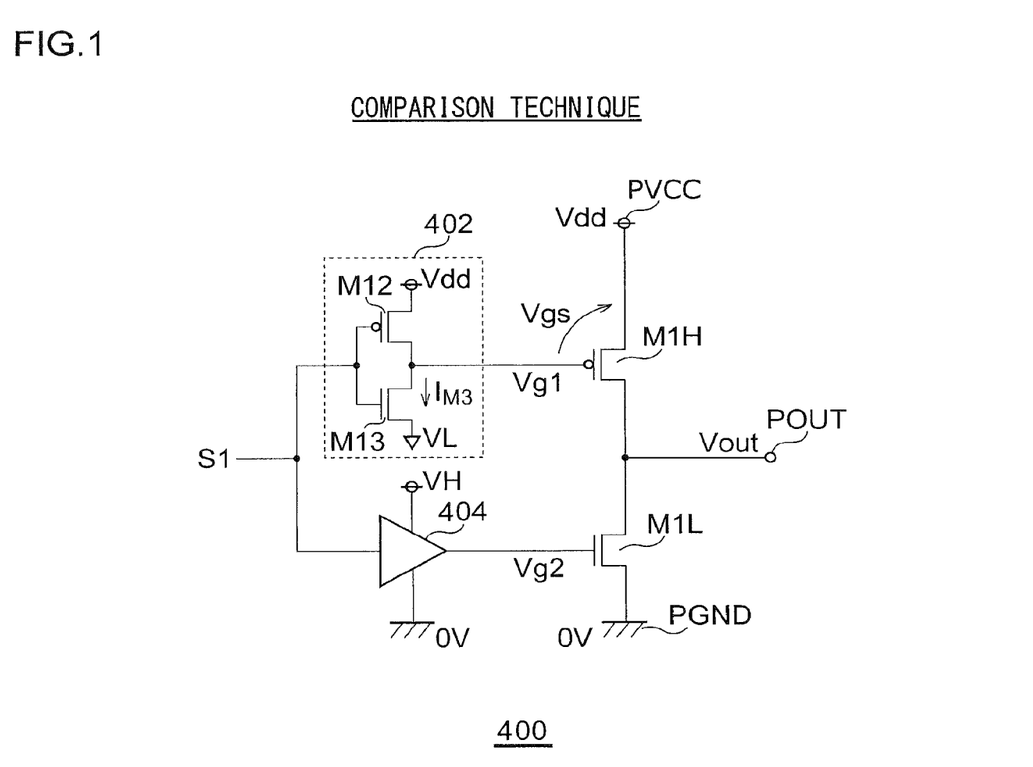
FIG. 1 is a circuit diagram which shows a configuration of an ordinary half-bridge circuit.

In the field of electronic circuits, half-bridge circuits, H-bridge circuits, and source follower circuits are widely employed. FIG. 1 is a circuit diagram which shows the configuration of an ordinary half-bridge circuit 400. The half-bridge circuit 400 outputs, via an output terminal POUT, the power supply voltage Vdd or the ground voltage 0V, or an intermediate voltage between the two.

The half-bridge circuit 400 includes a high-side transistor M1H and a low-side transistor M1L, which each function as a power transistor, and pre-drivers 402 and 404 configured to drive these power transistors. The high-side transistor M1H and the low-side transistor MIL are connected in series between the power supply terminal PVCC and the ground line PGND. The high-side transistor M1H is an N-channel MOSFET (Metal Oxide Semiconductor Field Effect Transistor), and the low-side transistor M1L, is a P-channel MOSFET.

The pre-drivers 402 and 404 switch on the high-side transistor M1H and the low-side transistor M1L, in a complementary manner according to a control signal S1. When the high-side transistor M1H is switched to the ON state, the output voltage Vout is switched to the power supply voltage Vdd, and when the low-side transistor M1L is switched to the ON state, the output voltage Vout is switched to the ground voltage 0 [V].

The pre-driver 402 for the high-side transistor supplies, to a control terminal (gate) of the high-side transistor M1H, a gate voltage Vg1 at the high level (Vdd) or the low level (VL) according to the control signal S1. Similarly, the pre-driver 404 for the low-side transistor supplies, to the gate of the low-side transistor M1L, a gate voltage Vg2 at the high level (VH) or the low level (0 V) according to the control signal S1.

There is a need to determine the electric potential VL of the low level of the gate voltage Vg1 giving consideration to the gate-source breakdown voltage of the high-side transistor M1H. Specifically, the voltage VL of the gate voltage Vg1 is designed such that the gate-source voltage (Vdd−VL) does not exceed the gate-source breakdown voltage.

RELATED ART DOCUMENTS

Patent Documents

[Patent Document 1] Japanese Patent Application Laid Open No. 2001-160615

In general, each of the pre-drivers 402 and 404 includes a CMOS inverter. In FIG. 1, the pre-driver 402 includes two transistors M12 and M13 arranged in series between the power supply voltage Vdd and the low-level voltage VL. The low-level voltage VL is stabilized by an unshown constant voltage circuit such as a regulator or the like.

Description will be made regarding the operation of such an arrangement when the high-side transistor M1H is switched from the OFF state to the ON state.

When the high-side transistor M1H is switched to the OFF state, the pre-driver 402 switches the gate voltage Vg1 of the high-side transistor M1H from the high level (Vdd) to the low level (VL). Directing attention to the internal configuration of the pre-driver 402, the state of the pre-driver 402 is switched from the state in which the transistor M12 is ON and the transistor M13 is OFF to the state in which the transistor M12 is OFF and the transistor M13 is ON.

Such a transition involves a steep current impulse $I_{M3}$ flowing through the transistor M13 due to the gate capacitance of the high-side transistor M1H. In this case, when the feedback speed of the constant voltage circuit is insufficient, the low level voltage VL temporarily rises. The increase in the low level voltage VL leads to an increase in the gate voltage Vg1. Accordingly, in this case, the voltage between the gate and source of the high-side transistor M1H becomes lower than a threshold voltage Vt, leading to a malfunction in which the high-side transistor is switched to the OFF state at an undesired timing.

As a first approach for resolving this problem, a method is known in which a low performance device is employed as the pre-driver 402. That is to say, a device with a large ON resistance (a small size MOSFET or a bipolar transistor) is employed as the transistor M13. With such an arrangement, the current that flows into the constant voltage circuit via the transistor M13 is limited, thereby suppressing an increase in the low level voltage VL. However, such an approach reduces the switching speed of the high-side transistor M1H. This increases the current that flows through the high-side transistor M1H and the low-side transistor M1L, leading to a problem of increased power consumption.

As a second approach, a method is known in which a clamp circuit is provided such that the gate voltage for the high-side transistor M1H does not exceed a predetermined value. With such an arrangement, the voltage between the gate and the source of the transistor M1H does not become lower than the threshold voltage Vt, thereby preventing the transistor M1H from switching to the OFF state at an undesired timing. However, such an arrangement requires that the source voltage of the high-side transistor M1H (power supply voltage Vdd) be maintained at a constant value. Accordingly, it is difficult to employ such an arrangement in a circuit having a power supply voltage Vdd that changes over time.

Such a problem can occur in the low-side transistor M1L. Also, such a problem can occur in an H-bridge circuit or a source follower circuit.

SUMMARY OF THE INVENTION

The present invention has been made in order to solve such a problem. Accordingly, it is an exemplary purpose of the present invention to provide a technique for preventing malfunction of a power transistor.

An embodiment of the present invention relates to an output circuit configured to output a voltage via an output terminal according to a control signal. The output circuit comprises: a power transistor arranged between the output terminal and a first terminal at which the electric potential is set to a fixed value; a pre-driver including a high-side transistor and a low-side transistor connected in series between the first terminal and a second terminal, the ON/OFF operations of which are controlled in a complementary manner according to the control signal, and configured to output, as a driving signal to a control terminal of the power transistor, the electric potential at a connection node that connects the two transistors; and a constant voltage circuit configured to stabilize the voltage at the second terminal at a predetermined voltage. The constant voltage circuit comprises: an output transistor arranged between the second terminal and a third terminal at which the electric potential is set to a fixed level; a differential amplifier configured to adjust the voltage to be applied to the control terminal of the output transistor such that the electric potential at the second terminal approaches a predetermined target value; and a feedback capacitor arranged between the second terminal and the control terminal of the output transistor.

With such an embodiment, the electric potential at the second terminal is controlled by two feedback operations, i.e., the feedback operation by the differential amplifier and the feedback operation by the feedback capacitor. Thus, such an arrangement reduces fluctuation of the voltage that occurs at the second terminal. This reduces fluctuation of the voltage that occurs at the control terminal of the power transistor, thereby preventing malfunction of the power transistor.

An output circuit according to an embodiment may further comprise a clamp circuit configured to clamp, to a predetermined clamp voltage, the difference in voltage between the first terminal and the second terminal.

By providing such a clamp circuit, such an arrangement protects the power transistor.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
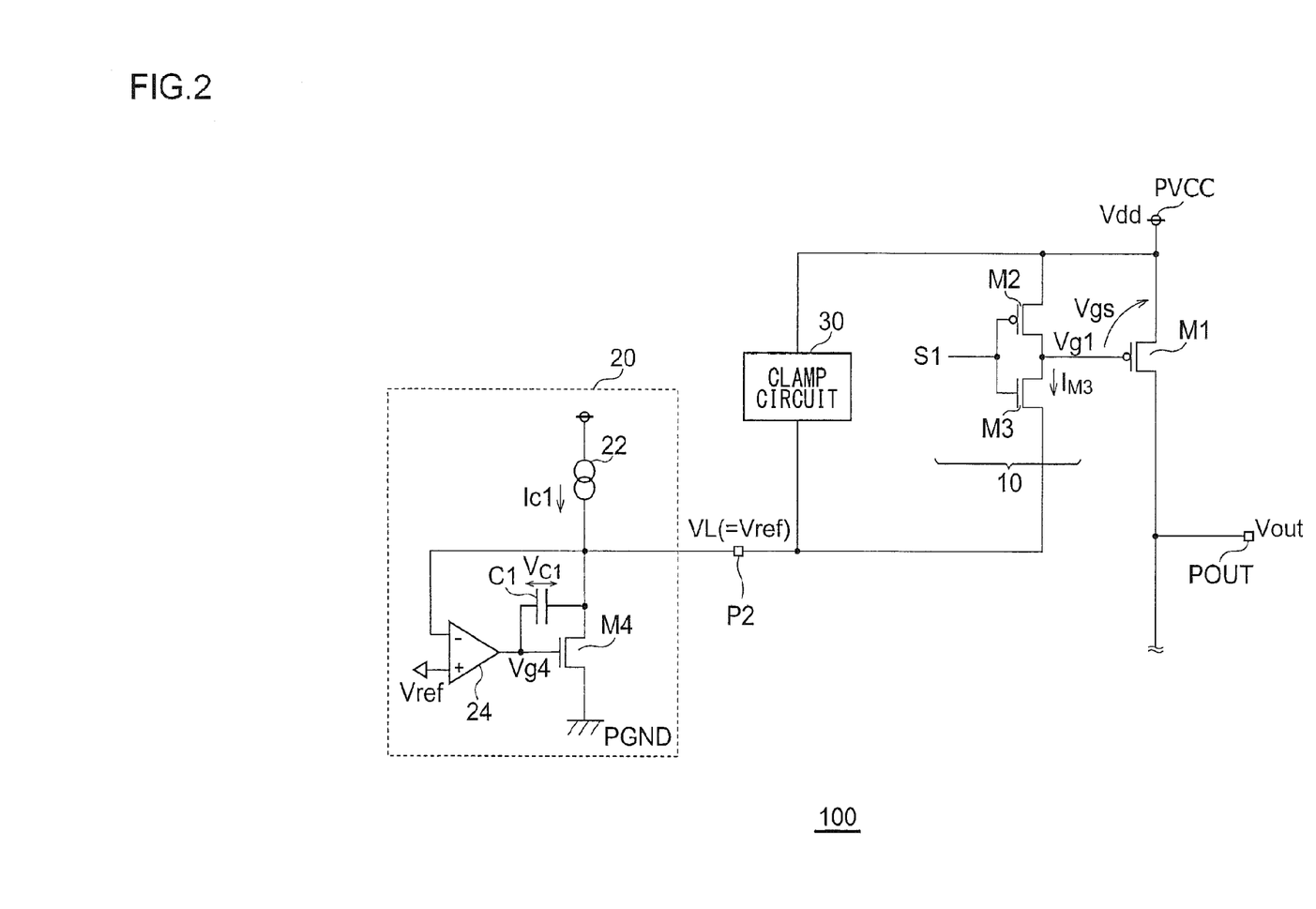
FIG. 2 is a circuit diagram which shows a configuration of an output circuit according to an embodiment.

FIG. 2 is a circuit diagram which shows the configuration of an output circuit 100 according to an embodiment. The output circuit 100 outputs, via an output terminal POUT thereof, either a power supply voltage Vdd or a voltage that differs from the power supply voltage Vdd (e.g., ground voltage) according to the level of a control signal S1. The output circuit 100 is provided as one part of a half-bridge circuit, one part of an H-bridge circuit, or one part of a source follower circuit.

The output circuit 100 includes a power transistor M1, a pre-driver 10, a constant voltage circuit 20, and a clamp circuit 30.

The power transistor M1 is provided between the output terminal POUT and a first terminal (power supply terminal PVCC) at which the electric potential is fixed. The power transistor M1 is a P-channel MOSFET, the source of which is connected to the power supply terminal PVCC, and the drain of which is connected to the output terminal POUT.

The pre-driver 10 includes two transistors M2 and M3 connected in series between the first terminal (power supply terminal PVCC) and a second terminal P2. The high-side transistor M2 is a P-channel MOSFET, and the low-side transistor M3 is an N-channel MOSFET. These transistors M2 and M3 form a so-called CMOS inverter. The ON/OFF operations of the transistors M2 and M3 are controlled in a complementary manner according to a control signal S1. The electric potential at a connection node that connects the two transistors M2 and M3 is supplied as a driving signal to a control terminal (gate) of the power transistor M1.

The constant voltage circuit 20 is a buffer circuit which stabilizes the electric potential at the second terminal P2 which determines the low level voltage VL for the pre-driver 10. The constant voltage circuit 20 includes an output transistor M4, a differential amplifier 24, a feedback capacitor C1, and a current source 22.

The output transistor M4 is provided between the second terminal P2 and a third terminal (ground terminal PGND) at which the electric potential is maintained at a constant level. The output transistor M4 is an N-channel MOSFET, the source of which is connected to the ground terminal PGND, and the drain of which is connected to the second terminal P2. An N-channel MOSFET having ON resistance of 10 to 100 [Ω] is employed as the output transistor M4. The current source 22 supplies a predetermined bias current (drain current) to the output transistor M4. For example, a bias current Ic1 of around 100 [μA] is supplied.

The differential amplifier 24 adjusts a voltage Vg4 at a control terminal (gate) of the output transistor M4 such that the electric potential at the second terminal P2, i.e., the low level voltage VL approaches a predetermined target value. Specifically, a predetermined reference voltage Vref is input to the non-inverting input terminal of the differential amplifier 24. On the other hand, the inverting input terminal thereof is connected to the second terminal P2. With such an arrangement, the feedback operation is performed such that the electric potential VL at the second terminal P2 matches the reference voltage Vref. That is to say, the relation VL=Vref is satisfied.

The value of the low level voltage VL is determined such that the gate-source voltage Vgs of the power transistor M1 does not exceed its breakdown voltage VGSS. When the power transistor M1 is switched to the ON state, the gate-source voltage Vgs thereof is represented by Expression Vgs=Vdd−Vg1=Vdd−VL. Accordingly, the low level voltage VL is determined such that the relation Vdd−VL<VGSS is satisfied. In a case in which VDD is 15 [V], and VGSS is 5 [V], the low level voltage VL is designed to be 10 [V] or more.

In the constant voltage circuit 20, the voltage obtained by multiplying the voltage VL at the second terminal P2 by k (k is an integer) by means of voltage division may be supplied as a feedback voltage to the non-inverting input terminal of the differential amplifier 24. With such an arrangement, the low level voltage VL is stabilized at VL=Vref/k.

The feedback capacitor C1 is arranged between the second terminal P2 and the control terminal (gate) of the output transistor M4. The feedback capacitor C1 is preferably provided with a capacitance of 10 pF or more and with a size which can be integrated on a semiconductor substrate. In actuality, the capacitance of the feedback capacitor C1 is set in a range between 10 pF and 100 pF.

In the circuit shown in FIG. 2, the gate voltage Vg4 of the output transistor M4 is controlled by two feedback operations, i.e., a feedback operation by the differential amplifier 24 and a feedback operation by the feedback capacitor C1. The speed of the feedback operation performed by the feedback capacitor C1 is more satisfactory than that performed by the differential amplifier 24.

The clamp circuit 30 is provided for the purpose of protecting the power transistor M1. The clamp circuit 30 clamps the difference in the electric potential between the first terminal (power supply terminal PVCC) and the second terminal P2 to a predetermined clamp voltage VCL. That is to say, the voltage VL at the second terminal P2 is limited to a range represented by the following Expression (1).

$$VL > Vdd - VCL \quad (1)$$

As described above, the source-gate voltage Vgs of the power transistor M1 in the ON state is represented by the following Expression (2).

$$Vgs = Vdd - VL \quad (2)$$

Accordingly, following Expressions (1) and (2), the gate-source voltage Vgs of the power transistor M1 is limited such that Vgs<VCL. By deciding on a clamp voltage VCL that does not exceed the gate-source breakdown voltage of the power transistor M1, such an arrangement suitably protects the power transistor M1 from fluctuations in the power supply or the like.

Figure 3A:
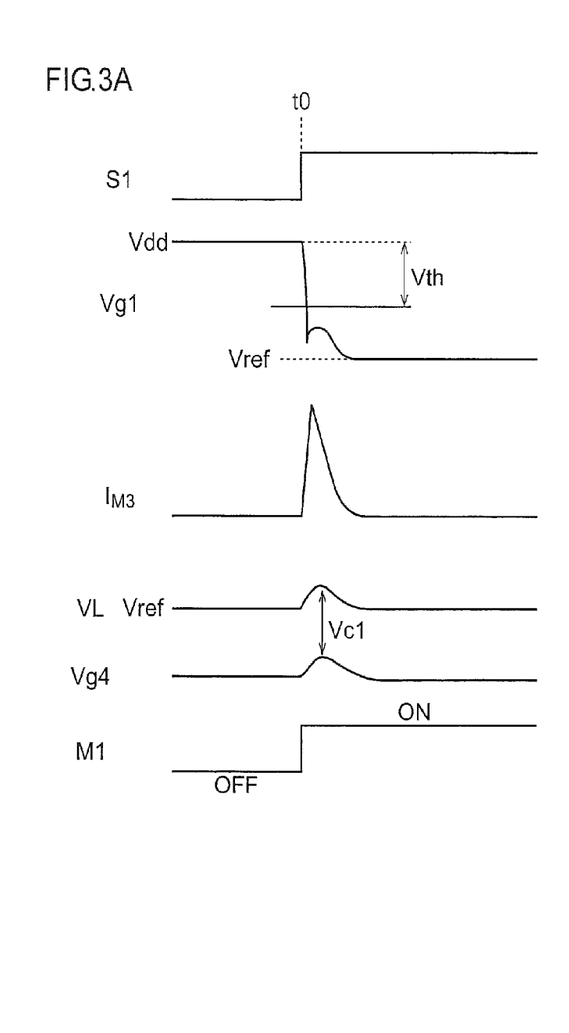
FIGS. 3A and 3B are time charts which show the operation of the output circuit shown in FIG. 2 and the operation of the output circuit according to a comparison technique, respectively.
Figure 3B:
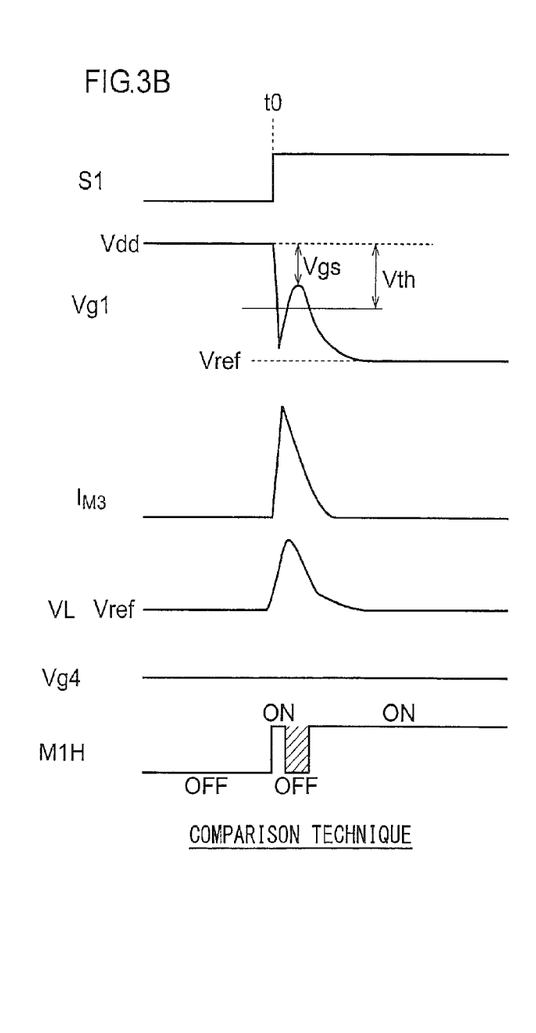

The above is the configuration of the output circuit 100. Next, description will be made regarding the operation thereof. FIGS. 3A and 3B are time charts which show the operation of the output circuit 100 shown in FIG. 2 and the operation of an output circuit according to a comparison technique, respectively.

In order to clarify the advantage of the embodiment, description will be made with reference to FIG. 3B regarding the operation of an output circuit according to the comparison technique shown in FIG. 1.

Before the time point t0, the control signal S1 is in the low-level state, the high-side transistor M1H is in the ON state, and the low-side transistor M1L is in the OFF state. In this stage, the output voltage Vout is represented by Expression Vout=Vdd.

When the control signal S1 is switched to the high-level state at the time point t0, the transistor M13 is switched to the ON state. In this stage, the charge stored in the gate capacitance of the high-side transistor M1H flows into the transistor M13 in the form of a current $I_{M3}$. The electric potential at the source terminal of the transistor M13 is stabilized at the low level voltage VL by an unshown constant voltage circuit. However, the speed of the voltage regulation operation of the constant voltage circuit is insufficient to cancel the steep impulse of the current $I_{M3}$ that flows into the transistor M13, leading to an increase in the low level voltage VL. After the time point t0, the low level voltage VL is to be supplied as the gate voltage Vg1 to the high-side transistor M1H. However, in a case in which the gate-source voltage Vgs of the high-side transistor M1H is smaller than a threshold voltage Vth due to such an increase in the low level voltage VL, malfunction occurs in which the high-side transistor M1H is switched to the OFF state at an undesired timing (hatched region shown in FIG. 3B).

Next, description will be made with reference to FIG. 3A regarding the operation of the output circuit 100 shown in FIG. 2.

At the time point t0, the control signal S1 is switched from the low-level state to the high-level state. Upon receiving the high-level state of the control signal S1 thus switched, the transistor M3 is switched to the ON state. In this stage, the charge stored in the gate capacitance of the high-side transistor M1 flows into the transistor M3 in the form of a current $I_{M3}$. The electric potential at the source terminal of the transistor M3 (second terminal P2) is stabilized at the low level voltage VL (=Vref) by the constant voltage circuit 20. However, the speed of the voltage regulation operation of the constant voltage circuit 20 is insufficient to cancel the steep impulse of the current $I_{M3}$ that flows into the transistor M3. Accordingly, the low level voltage VL starts to rise. The mechanism thus far described above is the same as that of the circuit shown in FIG. 1.

In the output circuit 100 shown in FIG. 2, the feedback capacitor C1 is provided between the gate and the drain of the output transistor M4. The capacitance of the feedback capacitor C1 is large enough to maintain the voltage $V_{c1}$ between the terminals of the feedback capacitor C1 at a constant level. That is to say, the feedback capacitor C1 functions as a kind of voltage source, which functions so as to maintain the difference in voltage between the gate and the drain of the output transistor M4 at a constant level (Vref−Vg4). Accordingly, when the electric potential VL at the second terminal P2 rises, the gate voltage Vg4 of the output transistor M4 also rises. Such an increase in the gate voltage Vg4 of the output transistor M4 strengths the level of the ON state of the transistor M4, which functions so as to reduce the low level voltage VL of the second terminal p2. As a result, the rising of the low level voltage VL is reduced as compared with an arrangement shown in FIG. 3B. By reducing the rising of the low level voltage VL, such an arrangement reduces the rising of the gate voltage Vg1 of the power transistor M1.

As described above, the output circuit 100 shown in FIG. 2 prevents malfunction in which the power transistor M1 is switched to the OFF state at an undesired timing.

With the output circuit 100 shown in FIG. 2, there is no need to lower the performance of the pre-driver 10, thereby enabling the power transistor M1 to be switched at a high speed. This means that such an arrangement reduces the period of time in which the power transistor M1 operates in the linear region, thereby reducing power consumption of the output circuit 100.

Furthermore, there is no need to provide a clamp circuit between the second terminal P2 and the ground terminal PGND in order to reduce the rising of the voltage VL at the second terminal P2, thereby providing a simple circuit. Moreover, in a case in which such a clamp circuit is provided, the output circuit 100 can operate with the power supply voltage Vdd in only a narrow range. Contrastingly, the output circuit 100 according to the embodiment is capable of operating in a wide voltage range.

Figure 4:
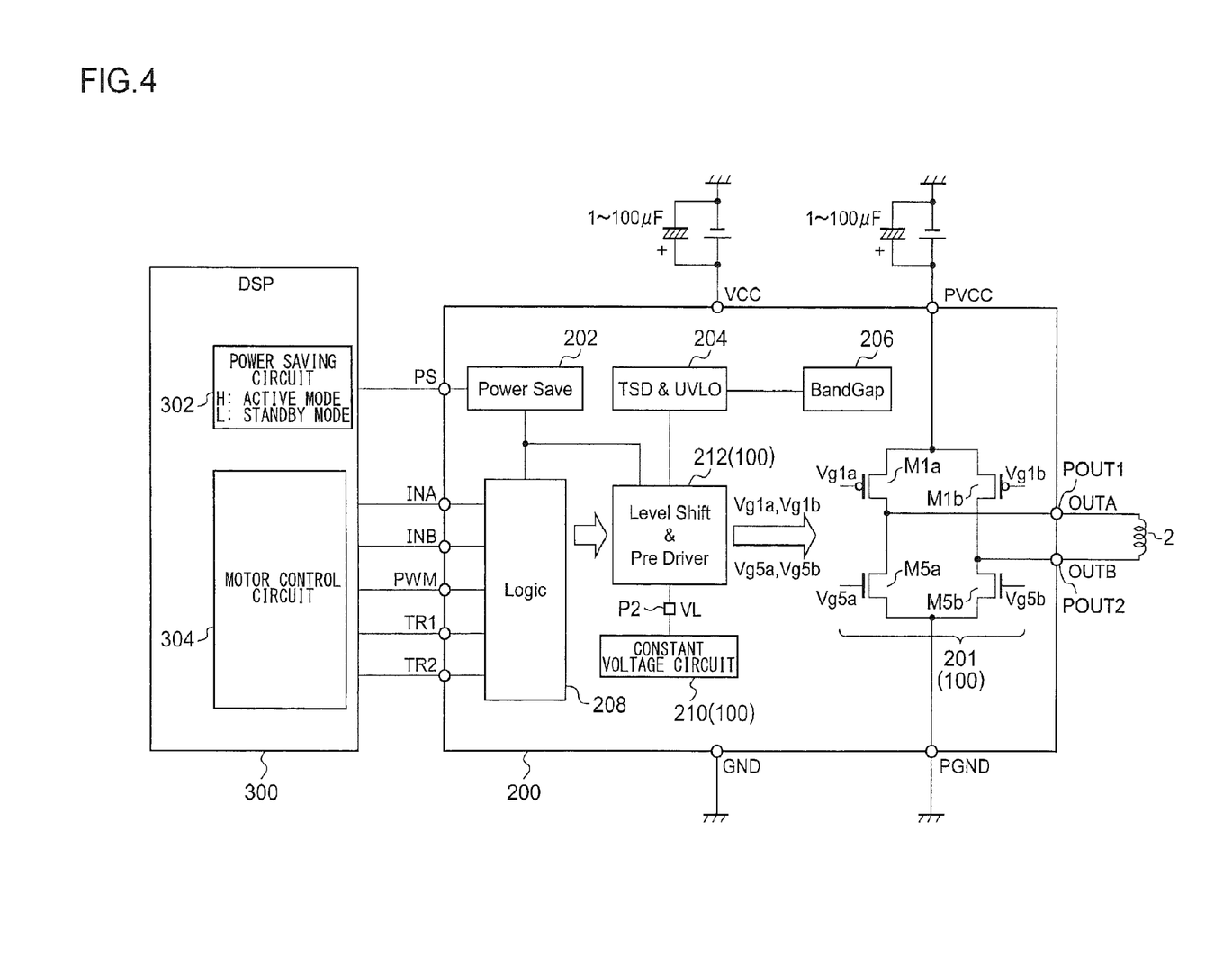
FIG. 4 is a block diagram which shows a configuration of a motor driving apparatus employing the output circuit shown in FIG. 2.

Next, description will be made regarding an application of the output circuit 100 according to the embodiment. FIG. 4 is a block diagram which shows the configuration of a motor driving apparatus using the output circuit 100 shown in FIG. 2. The motor driving apparatus 200 includes an H-bridge circuit 201, a power saving circuit 202, a thermal shutdown/ low-voltage lockout circuit 204, a band gap circuit 206, a logic unit 208, and a constant voltage circuit 210, which are integrated on a single semiconductor substrate.

The H-bridge circuit 201 includes two high-side transistors M1a and M1b and two low-side transistors M5a and M5b. Each of the transistors M1a and M1b corresponds to the power transistor M1 shown in FIG. 2. A motor 2 is connected to the H-bridge circuit 201.

A level shifter/pre-driver circuit 212 generates gate voltages Vg1a, Vg1b, Vg5a, and Vg5b for the transistors M1a, M1b, M5a, and M5b, respectively, which form the H-bridge circuit 201. The level shifter/pre-driver circuit 212 includes a first pre-driver which outputs a driving signal for the power transistor M1a, and a second pre-driver which outputs a driving signal for the power transistor M1b. Each of these two pre-drivers corresponds to the pre-driver 10 shown in FIG. 2. The constant voltage circuit 210 corresponds to the constant voltage circuit 20 shown in FIG. 2. The constant voltage circuit 210 is shared by the first and second pre-drivers for driving the power transistors M1a and M1b.

The band gap circuit 206 generates a reference voltage. The thermal shutdown/low-voltage lockout circuit 204 monitors the temperature of the motor driving apparatus 200. When the temperature thus monitored is equal to or greater than a predetermined temperature, it is judged that an abnormal temperature has been detected. When an abnormal temperature has been detected, the motor driving apparatus 200 stops the driving operation of the motor 2 (thermal shutdown function). Furthermore, the thermal shutdown/low-voltage lockout circuit 204 monitors at least one of the power supply voltages VCC and PVCC. In a case in which the power supply voltage thus monitored is smaller than a predetermined reference voltage, the thermal shutdown/low-voltage lockout circuit 204 judges that an abnormal low voltage has been detected, and shuts down the motor driving apparatus 200.

The motor driving apparatus 200 includes two power supply terminals VCC and PVCC and two ground terminals GND and PGND. One set of a power supply terminal PVCC and a ground terminal PGND is connected to the H-bridge circuit 201. Another set of a power supply terminal VCC and a ground terminal GND is connected to other circuit blocks. That is to say, the H-bridge circuit 201 uses its own power supply independent of the power supply for the other circuit blocks. By separating one set of a power supply and a ground, for a path through which a large current is to be passed, from another set of a power supply and a ground, for another path through which there is no need to pass a large current, such an arrangement prevents noise that occurs in the path via which a large current is passed from propagating to the path through which there is no need to pass a large current.

The motor driving apparatus 200 operates according to a control signal received from a DSP (Digital Signal Processor) 300. A power saving circuit 302 generates a PS signal. A motor control input circuit 304 generates control signals INA, INB, PWM, TR1, and TR2, and outputs each signal to a corresponding terminal of the output circuit 100. The name of each control signal corresponds to the name of the terminal to which the signal is to be input.

Figure 5A:
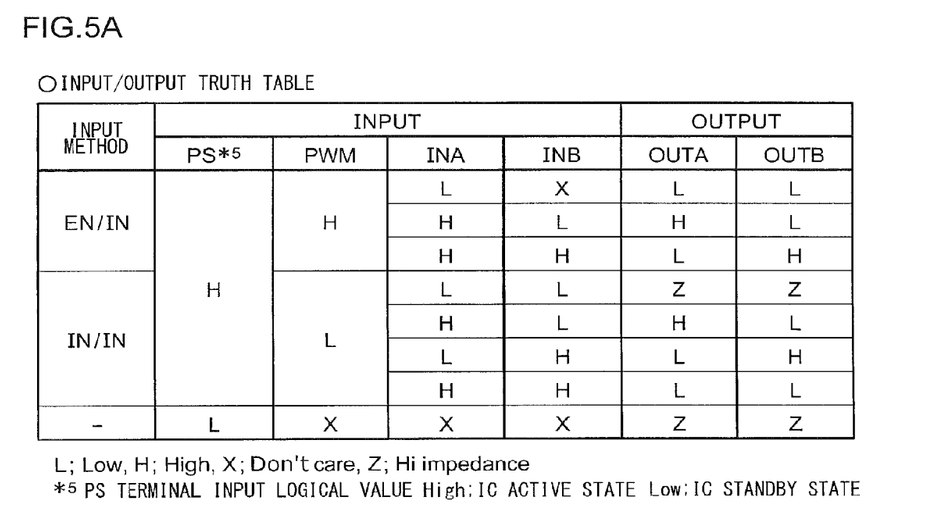
FIG. 5A is a truth table which shows the relation between a control signal and the state of the motor driving apparatus.

FIG. 5A is a truth table which shoes the relation between the control signal and the state of the motor driving apparatus.

PS (Power Saving) Signal

When the PS signal is at the high level, the motor driving apparatus 200 switches the motor driving apparatus 200 itself to the active mode. On the other hand, the PS signal is at the low level, the motor driving apparatus 200 switches the motor driving apparatus 200 itself to the standby mode.

When the motor driving apparatus 200 is in the active mode, the logic unit 208, the level shifter/pre-driver circuit 212, the constant voltage circuit 210, and the H-bridge circuit 201 generate output signals OUTA and OUTB having the levels that correspond to the PWM signal, the INA signal, the INB signal. The output signals OUTA and OUTS thus generated are output via a first output terminal POUT' and a second output terminal POUT2, respectively.

In the standby mode, each block of the motor driving apparatus 200 stops its operation, and all the transistors included in the H-bridge circuit 201 are switched to the OFF state. In this stage, the outputs OUTA and OUTS are in the high-impedance state.

INA Signal, INB Signal, PWM Signal

These control signals determine the states of the output signals OUTA and OUTB in the active mode. When the PWM signal is at the high level, the polarity of the output signals OUTA and OUTB, i.e., whether the motor 2 is in the forward rotation mode or in the reverse rotation mode, is determined by the INB signal alone. When the PWM signal is at the low level, such an arrangement is capable of determining whether the motor 2 is in the forward rotation mode or in the reverse rotation mode by switching both the INA signal and the INB signal.

TR1 Signal, TR2 Signal (Output Switching Speed Control Signal)

Figure 5B:
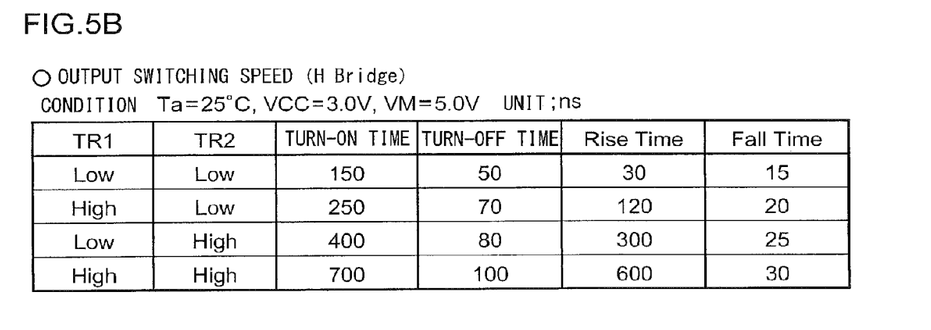
FIG. 5B is a table which shows the relation between the control signal and the switching speed.

The TR1 signal and the TR2 signal are signals for controlling the turn-on time, the turn-off time, the rising time, and the falling time of the H-bridge circuit. FIG. 5B is a table which represents the relation between the control signals and the switching speed. The logic unit 208 receives these signals via the output switching speed control terminals TR1 and TR2, and controls the H-bridge circuit according to the values of these signals.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made regarding an arrangement in which a P-channel MOSFET is employed as the high-side power transistor M1. Also, the present invention can be applied to an arrangement in which an N-channel MOSFET is employed as the high-side power transistor M1. Furthermore, the present invention can also be effectively applied in order to prevent malfunction of the low-side power transistor included in a half-bridge configuration or a full-bridge configuration.

For example, the output circuit 100 according to the embodiment is suitably employed in motor drivers, switching regulators, or lighting inverters for discharge lamps.

While the preferred embodiments of the present invention have been described using specific terms, such description is for illustrative purposes only, and it is to be understood that changes and variations may be made without departing from the spirit or scope of the appended claims.

What is claimed is:

1. An output circuit configured to output a voltage via an output terminal according to a control signal, the output circuit comprising:
   a power transistor arranged between the output terminal and a first terminal at which the electric potential is set to a fixed value;
   a pre-driver including a high-side transistor and a low-side transistor connected in series between the first terminal and a second terminal, the ON/OFF operations of which are controlled in a complementary manner according to the control signal, and configured to output, as a driving signal to a control terminal of the power transistor, the electric potential at a connection node that connects the two transistors; and
   a constant voltage circuit configured to stabilize the voltage at the second terminal at a predetermined voltage,
   wherein the constant voltage circuit comprises
      an output transistor arranged between the second terminal and a third terminal at which the electric potential is set to a fixed level,
      a differential amplifier configured to adjust the voltage to be applied to the control terminal of the output transistor such that the electric potential at the second terminal approaches a predetermined target value, and
      a feedback capacitor arranged between the second terminal and the control terminal of the output transistor.

2. An output circuit according to claim 1, further comprising a clamp circuit configured to clamp, to a predetermined clamp voltage, the difference in voltage between the first terminal and the second terminal.

3. A motor driving apparatus comprising:
   a logic unit configured to receive a control signal for a motor as an input signal;
   a first output terminal connected to one terminal of a coil of the motor;
   a second output terminal connected to the other terminal of the coil of the motor;
   a first pre-driver including a high-side transistor and a low-side transistor connected in series between a first terminal at which the electric potential is set to a fixed level and a second terminal, the ON/OFF operations of which are controlled in a complementary manner according to a control signal output from the logic unit, and configured to output, as a first driving signal, the electric potential at a connection node that connects the two transistors;
   a second pre-driver having the same configuration as that of the first pre-driver, and configured to output a second driving signal;
   a constant voltage circuit configured to stabilize the voltage at each of the second terminals of the first and second pre-drivers at a predetermined voltage; and
   an H-bridge circuit including a first power transistor arranged between the first output terminal and a first terminal at which the electric potential is set to a fixed level, and configured to be controlled according to the first driving signal output from the first pre-driver, a second power transistor arranged between the second output terminal and the first terminal at which the electric potential is set to the fixed level and configured to be controlled according to the second driving signal output from the second pre-driver, a third power transistor arranged between the first output terminal and a third terminal set to a fixed electric potential that differs from the electric potential at the first terminal, and a fourth power transistor arranged between the second output terminal and the third terminal,
   wherein the constant voltage circuit comprises
   an output transistor arranged between the second terminal and the third terminal at which the electric potential is set to the fixed level,
   a differential amplifier configured to adjust the voltage to be applied to a control terminal of the output transistor such that the electric potential at the second terminal approaches a predetermined target value, and
   a feedback capacitor arranged between the second terminal and the control terminal of the output transistor.

4. A motor driving apparatus according to claim 3, further comprising a clamp circuit configured to clamp the difference in voltage between the first terminal and the second terminal to a predetermined clamp voltage.

5. A motor driving apparatus according to claim 3, wherein the logic unit receives, as the control signal, an output switching speed setting signal for setting the turn-on time and turn-off time for the H-bridge circuit,
   and wherein the logic unit generates a signal for the pre-driver according to the output switching speed setting signal thus received.

6. A motor driving apparatus according to claim 3, wherein the logic unit receives, as the control signal, an output switching speed setting signal for setting the rising time and the falling time of the H-bridge circuit,
   and wherein the logic unit generates a signal for the pre-driver according to the output switching speed setting signal thus received.

7. A motor driving apparatus according to claim 3, wherein the logic unit receives, as the control signal, a power saving signal for setting an active mode and a standby mode of the motor driving apparatus,
   and wherein the motor driving apparatus has a configuration which enables the state thereof to be switched between the active mode and the standby mode according to the power saving signal.

8. A motor driving apparatus according to claim 3, further comprising a thermal shutdown unit configured to stop the operation of the motor in a case in which the temperature of the motor driving apparatus is equal to or greater than a predetermined temperature.

9. A motor driving apparatus according to claim 3, further comprising a low-voltage lockout unit configured to stop the operation of the motor in a case in which the power supply voltage for the motor driving apparatus is equal to or smaller than a predetermined voltage.

10. A motor driving apparatus according to claim 3, further comprising two power supply terminals and two ground terminals,
    wherein a set of the power supply terminal and the ground terminal is connected to the H-bridge circuit, and another set of the power supply terminal and the ground terminal is connected to the other circuit blocks.

* * * * *